US 6,538,382 B2

(12) United States Patent
Kimura et al.

(10) Patent No.: US 6,538,382 B2
(45) Date of Patent: Mar. 25, 2003

(54) PLASMA DISPLAY APPARATUS HAVING REINFORCED ELECTRONIC CIRCUIT MODULE

(75) Inventors: Kenji Kimura, Kawasaki (JP); Takeshi Kawahara, Kawasaki (JP); Taizo Ohno, Higashimorokata (JP); Satoshi Watanabe, Kawasaki (JP); Shigeo Iriguchi, Kawasaki (JP); Takayoshi Nakamura, Tokyo (JP)

(73) Assignees: Fujitsu Limited, Kawasaki (JP); Fujitsu Hitachi Plasma Display Limited, Kawasaki (JP)

( * ) Notice: Subject to any disclaimer, the term of this patent is extended or adjusted under 35 U.S.C. 154(b) by 0 days.

(21) Appl. No.: 09/970,706

(22) Filed: Oct. 5, 2001

(65) Prior Publication Data
US 2002/0050788 A1 May 2, 2002

(30) Foreign Application Priority Data
Oct. 26, 2000 (JP) ........................................ 2000-327349

(51) Int. Cl.$^7$ ................................................ H01J 17/49
(52) U.S. Cl. ........................................ 313/582; 315/583

(58) Field of Search ......................... 313/582, 583, 313/586, 587

(56) References Cited

FOREIGN PATENT DOCUMENTS

| JP | 61-131492 | 6/1986 |
|----|-----------|--------|
| JP | 6-45364 | 6/1994 |
| JP | 7-66232 | 3/1995 |
| JP | 11-327458 | 11/1999 |
| JP | 11-327503 | 11/1999 |
| JP | 2000-100982 | 4/2000 |

*Primary Examiner*—Vip Patel
(74) *Attorney, Agent, or Firm*—Staas & Halsey LLP

(57) ABSTRACT

A plasma display apparatus has an electronic circuit module including a rigid substrate attached to a chassis thereof and a flexible substrate partially overlapped with the rigid substrate. The rigid substrate has chips and the flexible substrate has a first portion with apertures for exposing the chips and bonding pads and a second portion positioned on the outside of the rigid substrate. Bonding wires connect terminals of the chips with the bonding pads of the flexible substrate. A reinforcing pattern or a dummy pattern is provided in at least the first portion of the flexible substrate. The reinforcing pattern provides for rigidity for the first portion of the flexible substrate for accurate positioning of the bonding pads relative to the chips.

5 Claims, 11 Drawing Sheets

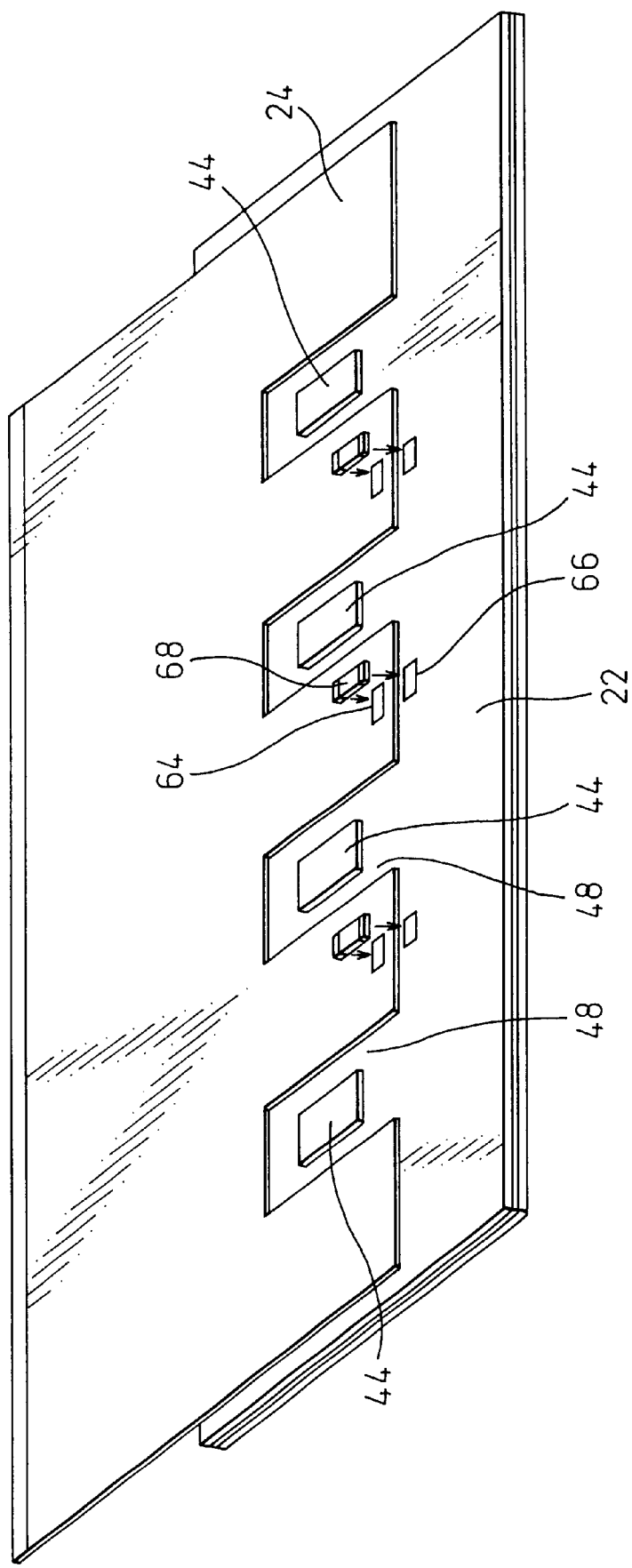

PLASMA DISPLAY APPARATUS HAVING REINFORCED ELECTRONIC CIRCUIT MODULE

BACKGROUND OF THE INVENTION

1. Field of the Invention

The present invention relates to a plasma display apparatus.

2. Description of the Related Art

A plasma display apparatus (PDP) comprises a plasma display panel having two glass substrates disposed in opposition, and a driving and controlling circuit part. One of the glass substrates has a plurality of parallel address electrodes, and the other glass substrate has a plurality of sustain electrodes disposed in parallel to each other and perpendicular to the address electrodes. The sustain electrodes include X electrodes and Y electrodes disposed alternately. Display cells are formed between two adjacent X electrode and Y electrode. The circuit part is disposed on the external surface of one of the glass substrates of the plasma display panel, and includes several rigid substrates. A flexible substrate is used for connecting electrodes of the plasma display panel and the rigid substrate.

The plasma display apparatus is disclosed in, for example, Japanese Unexamined Patent Publication (Kokai) No. 11-327503, and No. 11-327458.

Since the flexible substrate is flexible, it is necessary to use the flexible substrate at a curved portion. However, the flexible substrate is expensive, and the price thereof is two times the cost of a normal rigid substrate. Further, since the flexible substrate is used at the bent portion, warpage or breakage is apt to occur. Examples in which reinforcing patterns are provided at the peripheries of flexible substrates are disclosed in Japanese Unexamined Patent Publication (Kokai) No. 61-131492 and Japanese Unexamined Utility Model Publication (Kokai) No. 6-45364.

In the plasma display apparatus, the flexible substrate is used as a composite substrate or an electronic circuit module in which the flexible substrate is coupled and adhered to the rigid substrate. Therefore, the portion of the flexible substrate superimposed or the rigid substrate has no problem of warpage or breakage, which is likely to occur in an individual flexible substrate.

However, at the portion of superimposed portion between the rigid substrate and the flexible substrate, the rigid substrate holds bare chips, and the flexible substrate has apertures for exposing the bare chips and bonding pads, so that terminals of the bare chips and the bonding pads of the flexible substrate are connected together with bonding wires. In carrying out wire bonding, it is not possible to achieve wire bonding if there is a deviation between the position of the terminals of the bare chips and the position of the bonding pads of the flexible substrate. In many cases, the positional deviation occurs due to degradation in the precision of the size of the flexible substrate, particularly the degradation in the precision of the size around the aperture of the flexible substrate. The precision of the size around the aperture of the flexible substrate is degraded due to thermal contraction in the wire bonding at the time of connecting the flexible substrate to the rigid substrate.

Therefore, conventionally, the outer shape of the flexible substrate is designed to have a relatively large size, in particular, a relatively large size has been used for the width from the aperture of the flexible substrate to the outer edge thereof, thereby to try to prevent the degradation in the positional precision at the peripheral region of the aperture of the flexible substrate.

However, since the flexible substrate is expensive, the increase in the size of the outer shape of the flexible substrate leads to an increase in cost. Therefore, it has been desired to avoid occurrence of a positional deviation between the position of the terminals of the bare chip and the position of the bonding pads of the flexible substrate, without increasing the size of the outer shape of the flexible substrate.

Further, the flexible substrate is easily broken at a position that is brought into contact with the outer edge of the rigid substrate. Further, the flexible substrate is broken or distorted at a position on the outside of the rigid substrate. Further, as a high voltage is used in the plasma display apparatus, it has been desired to reduce the inductance of the conductor patterns of the flexible substrate.

SUMMARY OF THE INVENTION

It is an object of the present invention to provide a plasma display apparatus in which a satisfactory wire bonding can be carried out without increasing the size of the outer shape of a flexible substrate.

It is another object of the present invention to provide a plasma display apparatus capable of preventing occurrence of breakage or warpage of a flexible substrate.

It is still another object of the present invention to provide a plasma display apparatus capable of reducing the inductance of conductor patterns of a flexible substrate.

According to one aspect of the present invention, there is provided a plasma display apparatus comprising a plasma display panel having a plurality of electrodes for emission of light, an electronic circuit module including a rigid substrate having at least one chip, and a flexible substrate coupled to the rigid substrate and having a first portion with an aperture for exposing the chip and bonding pads and a second portion positioned on the outside of the rigid substrate, bonding wires connecting terminals of the chip with the bonding pads of the flexible substrate, and a reinforcing pattern provided in at least the first portion of the flexible substrate.

In this structure, the reinforcing pattern is provided in at least the first portion of the flexible substrate coupled to the rigid substrate. The reinforcing pattern is formed with a metal material that is the same as the metal material of conductor patterns. When the flexible substrate is connected to the rigid substrate or when the flexible substrate is wire bonded, a metal material does not thermally contract as easily as a resin that constitutes the flexible substrate. Therefore, a positional deviation does not occur easily. As a result, even when a distance from the aperture of the flexible substrate to the outer edge is decreased thereby relatively decreasing the size of the outer shape of the flexible substrate, the positional precision at portions around the aperture of the flexible substrate is not degraded. As the size of the outer shape of the flexible substrate can be made relatively small, it is possible to achieve a cost reduction.

According to another aspect of the present invention, there is provided a plasma display apparatus comprising a plasma display panel having a plurality of electrodes for emission of light, an electronic circuit module including a rigid substrate, and a flexible substrate coupled to the rigid substrate and having conductor patterns electrically connected to the electrodes of the plasma display panel, and a reinforcing pattern provided in a layer of the flexible substrate separate from a layer on which the conductor patterns exist.

In this structure, since the reinforcing pattern is provided in the layer of the flexible substrate separate from the layer on which conductor patterns exist, it is possible to prevent occurrence of breakage or warpage of the flexible substrate. Further, when a high voltage is applied to the conductor patterns of the flexible substrate, an eddy current is generated in the reinforcing pattern disposed opposite to the conductor patterns, based on an electromagnetic inductance. As a result, it is possible to reduce the inductance of the conductor patterns. Consequently, it is possible to obtain satisfactory display characteristics.

Preferably, the reinforcing pattern is provided at a position overlapping with the conductor patterns. For example, the reinforcing pattern is provided as a conductor film that extends along the outer edge of the rigid substrate. Although the flexible substrate is weak at a portion that is brought into contact with the outer edge of the rigid substrate, the flexible substrate is not easily broken as this flexible substrate is reinforced with the reinforcing pattern. Alternatively, the reinforcing pattern is provided as a completely covering conductor film on the portion of the flexible substrate positioned on the outside of the rigid substrate. Alternatively, the reinforcing pattern is provided as a conductor film including conductor strips provided corresponding to the individual conductor strips of the conductor patterns. As a result, the flexible substrate is not easily deformed, and the conductor patterns of the flexible substrate are not broken.

According to still another aspect of the present invention, there is provided a plasma display apparatus comprising a plasma display panel having a plurality of electrodes for emission of light, an electronic circuit module including a rigid substrate, and a flexible substrate coupled to the rigid substrate and having conductor patterns electrically connected to the electrodes of the plasma display panel, and a dummy pattern provided on the rigid substrate.

In this structure, when a high voltage is applied to conductor patterns of the flexible substrate, an eddy current is generated in the dummy pattern disposed opposite to the conductor patterns, based on an electromagnetic inductance. As a result, it is possible to reduce the inductance of the conductor patterns. Consequently, it is possible to obtain satisfactory display characteristics.

According to still another aspect of the present invention, there is provided a plasma display apparatus comprising a plasma display panel having a plurality of electrodes for emission of light, an electronic circuit module including a rigid substrate, and a flexible substrate coupled to the rigid substrate and having conductor patterns electrically connected to the electrodes of the plasma display panel, and an electric part having a first portion fixed to the flexible substrate and a second portion fixed to the rigid substrate.

In this structure, the electric part is disposed extending over the rigid substrate and the flexible substrate, thereby to electrically interconnect the rigid substrate and the flexible substrate. Therefore, it is possible to decrease the number of wires connecting the rigid substrate and the flexible substrate.

BRIEF DESCRIPTION OF THE DRAWINGS

The present invention will become more apparent from the following description of the preferred embodiments, with reference to the accompanying drawings, in which:

FIG. 18 is a view showing an example in which electric parts are provided extending over the flexible substrate and the rigid substrate.

DESCRIPTION OF THE PREFERRED EMBODIMENTS

Preferred embodiments of the present invention will be explained below with reference to the drawings.

Figure 1:
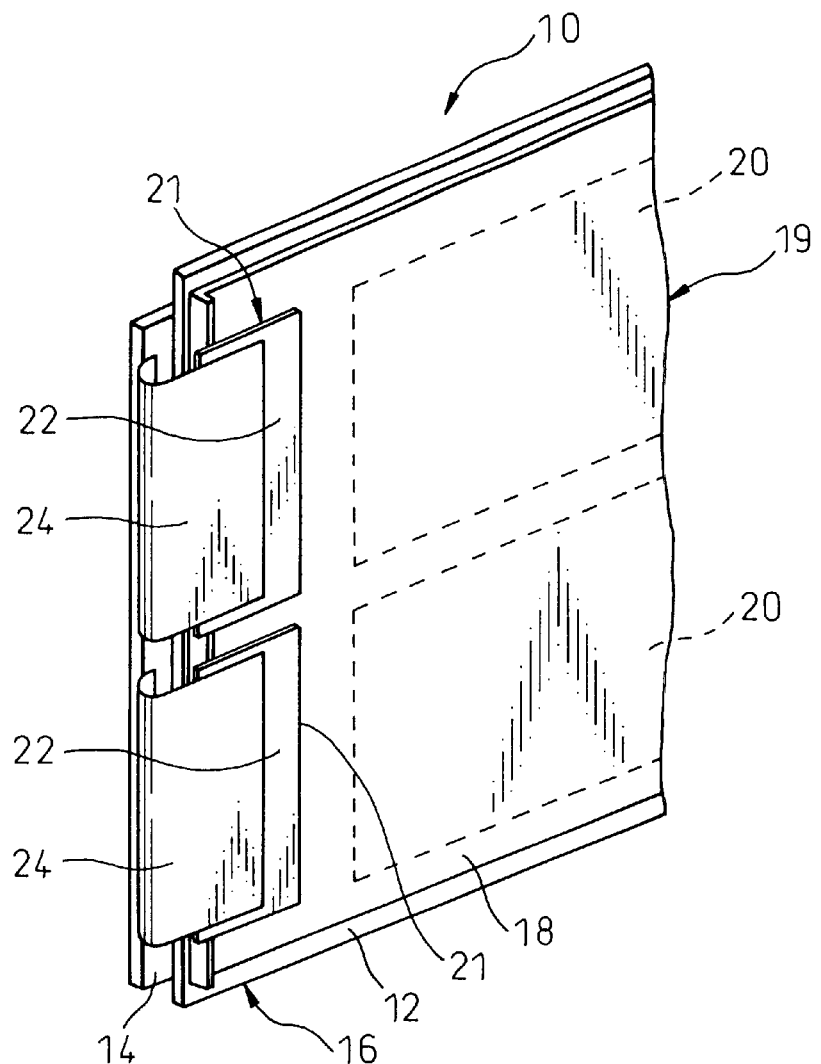
FIG. 1 is a perspective view showing a plasma display apparatus according to an embodiment of the present invention.
Figure 2:
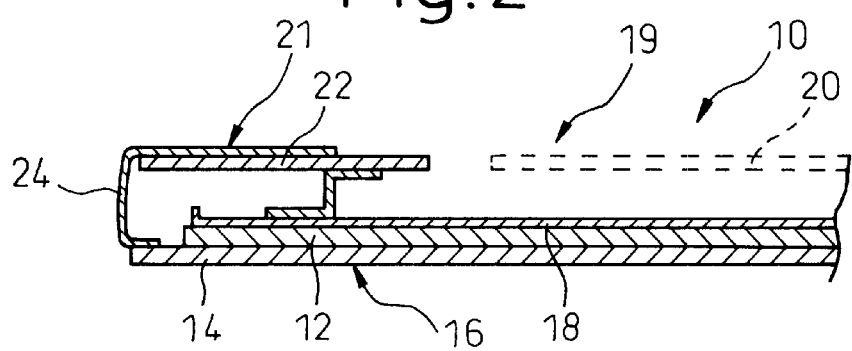
FIG. 2 is a cross-sectional view of the plasma display apparatus shown in FIG. 1.
Figure 3:
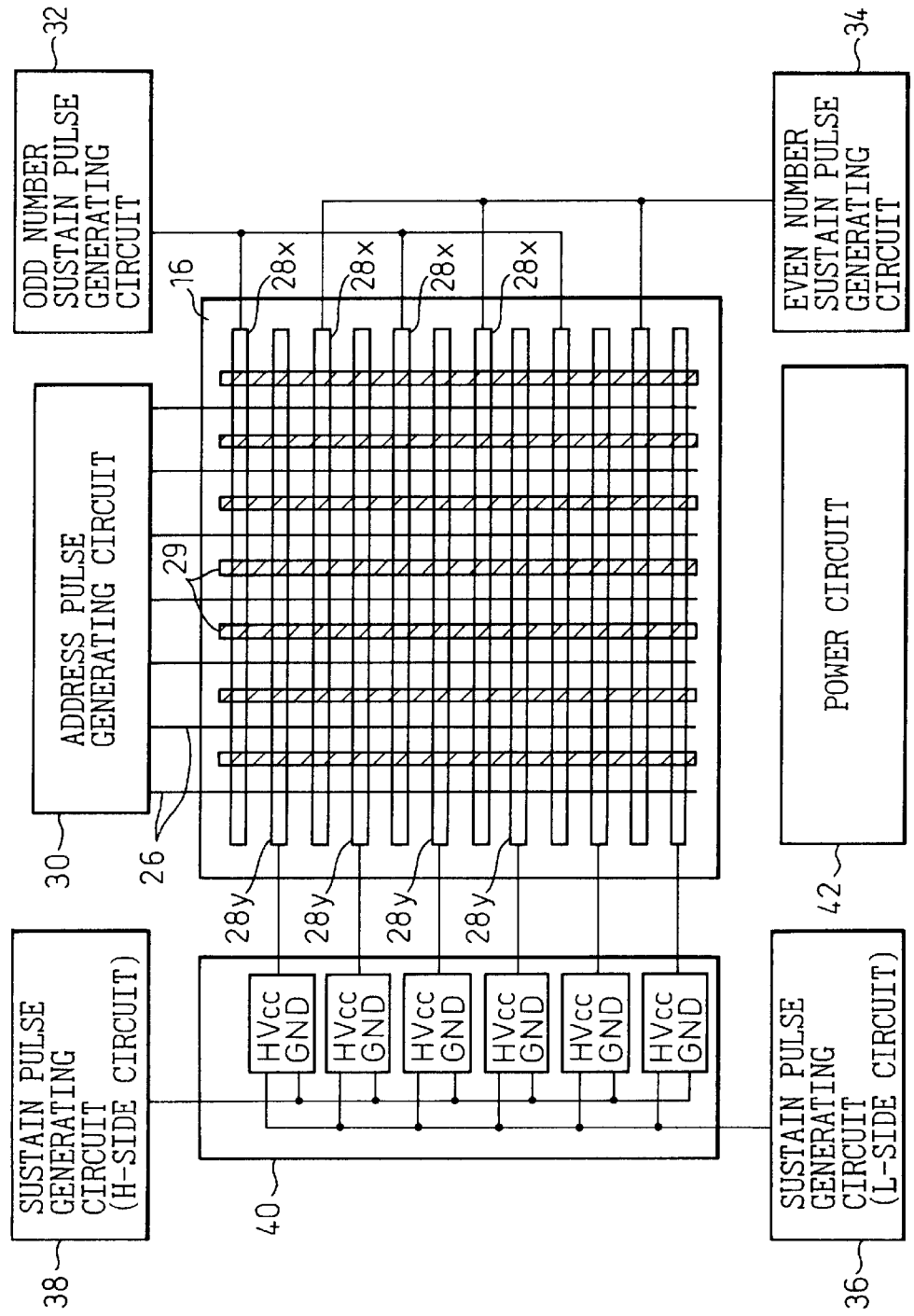
FIG. 3 is a diagram showing electrodes and sustain pulse generating circuits of the plasma display apparatus shown in FIG. 1 and FIG. 2.

FIG. 1 is a perspective view showing a plasma display apparatus according to an embodiment of the present invention. FIG. 2 is a cross-sectional view of the plasma display apparatus shown in FIG. 1. FIG. 3 is a view showing electrodes and sustain pulse generating circuits of the plasma display apparatus shown in FIGS. 1 and 2.

In FIGS. 1 and 2, the plasma display apparatus 10 comprises a plasma display panel 16 including glass substrates 12 and 14 disposed opposite to each other, a chassis 18 provided on one of the glass substrates 12, and a driving and controlling circuit part 19 provided on the chassis 18. In FIGS. 1 and 2, the circuit part 19 includes electronic circuit modules 20 and 21. Each of the electronic circuit modules 20 and 21 includes a rigid substrate 22 and a flexible substrate 24 coupled and adhered to the rigid substrate 22.

FIG. 3 is a view showing electrodes 26 and 28 provided on the plasma display panel 16 (the glass substrates 12 and 14) and circuit portions included in the circuit device 19. The glass substrate 12 has a plurality of address electrodes 26 disposed in parallel with each other. The glass substrate 14 has a plurality of sustain electrodes 28 extending in parallel with each other and perpendicular to the address electrodes 26. Partitions 29 are formed between two adjacent address electrodes 26 in parallel with the address electrodes 26.

The sustain electrodes 28 include X electrodes 28x and Y electrodes 28y disposed alternately. That is, the sustain electrodes 28 include a first x electrode 28x, a first Y electrode 28y, a second x electrode 28x, a second Y electrode 28y, a third x electrode 28x, a third Y electrode 28y, a fourth x electrode 28x, a fourth Y electrode 28y, and so on, in this order from the top.

The circuit part 19 includes an address pulse generating circuit 30, X electrode sustain pulse generating circuits 32 and 34, Y electrode sustain pulse generating circuits 36 and 38, a scanning circuit 40, a power source circuit 42, and a control circuit (not shown) connected to these circuits. The address pulse generating circuit 30 supplies driving pulses to the address electrodes 26. The sustain pulse generating circuit 32 supplies driving pulses to odd number X electrodes 28x, and the sustain pulse generating circuit 34 supplies driving pulses to even number X electrodes 28x. The sustain pulse generating circuits 36 and 38 supply driving pulses to the Y electrodes 28y via the scanning circuit 40.

In this plasma display apparatus 10, the side of the glass substrate 14 is the display side. Display cells are formed between the adjacent X electrode 28x and Y electrode 28y. In one display cell, a high write voltage pulse is applied to between the address electrode 26 and the Y electrode 28y to generate a priming by discharge, and then a sustain voltage pulse is applied to between the X electrode 28x and the Y electrode 28y to sustain the discharge, to thereby emit light at the display cell.

Figure 4:
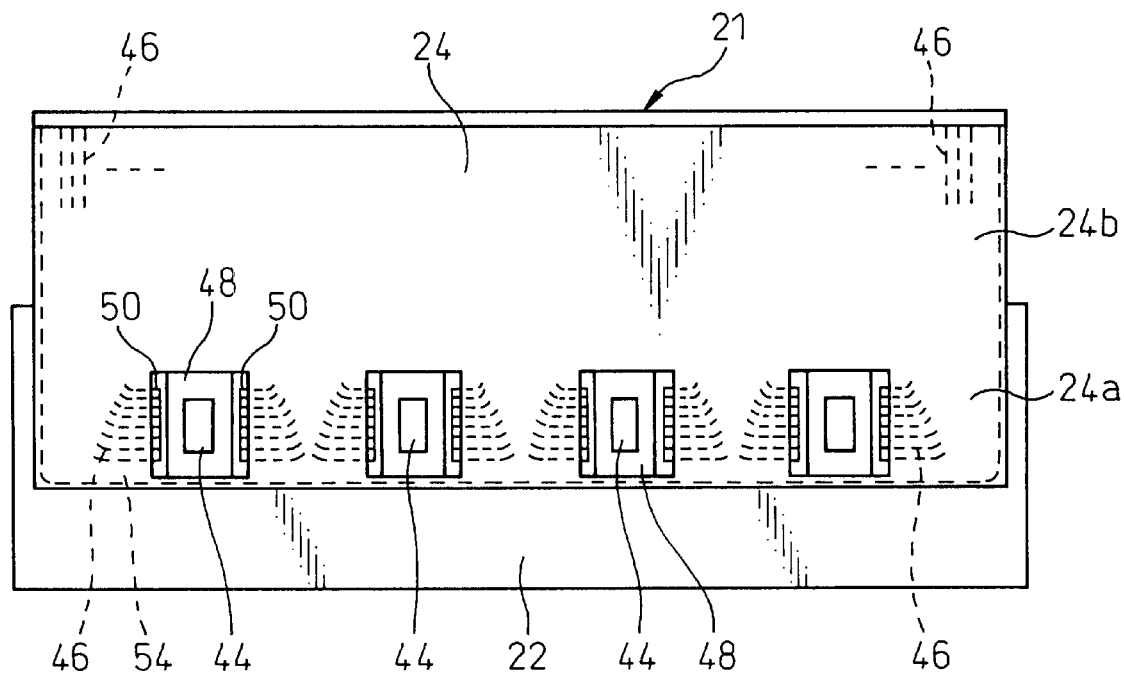
FIG. 4 is a plan view showing an example of the electronic circuit module.
Figure 5:
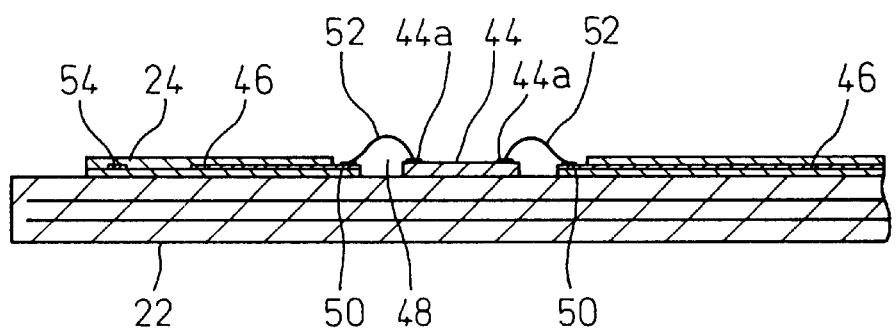
FIG. 5 is a cross-sectional view of the electronic circuit module shown in FIG. 4.

FIG. 4 is a plan view showing an example of the electronic circuit module 21. FIG. 5 is a cross-sectional view of the electronic circuit module 21 of FIG. 4. The rigid substrate 22 of the electronic circuit module 21 shown in FIGS. 1 to 5 includes the scanning circuit 40, which includes bare chips 44 and conductor patterns 46 connected to the bare chips 44.

The flexible substrate 24 has two resin layers and conductor patterns 46 sandwiched between the two resin layers. The flexible substrate 24 has a first portion 24a overlapping with and adhered to the rigid substrate 22, and a second portion 24b positioned on the outside of the rigid substrate 22. The second portion 24b is curved and connected to the electrodes 28y of the plasma display panel 16, as shown in FIG. 2.

The flexible substrate 24 has apertures 48 allowing the bare chips 44 to be exposed therethrough, and bonding pads 50 provided at the ends of the conductor patterns 46 close to the bare chips 44. Bonding wires 52 connect terminals 44a of the bare chips 44 with the bonding pads 50. FIG. 4 shows the state before the wire bonding is carried out, and FIG. 5 shows the state after the wire bonding is carried out. In the wire bonding, the terminals 44a of the bare chips 44 and the bonding pads 50 of the flexible substrate 24 must be positioned accurately.

In FIGS. 4 and 5, a reinforcing pattern 54 is provided at the peripheral region of the flexible substrate 24, without interfering with the wiring areas of signal lines. The reinforcing pattern 54 is not connected electrically. The reinforcing pattern 54 is preferably provided at least in the first portion 24a of the flexible substrate 24 near the apertures 48. The reinforcing pattern 54 is made of the same metal as that of the conductor patterns 46 in the form of a conductor line. By the provision of the reinforcing pattern 54, it is possible to prevent subtle deformation of portions of the flexible substrate 24 surrounding the aperture 48 due to thermal contraction or humidity change, even if the width from the aperture 48 to the outer edge of the flexible substrate 24 is decreased. Therefore, it becomes possible to secure positional precision of the bonding pads 50 with respect to the terminals of the bare chips 44. As a result, it is possible to achieve cost reduction, by decreasing the size of the shape of the relatively expensive flexible substrate 24.

It is possible to provide the reinforcing pattern 54 not only in a single layer of the flexible substrate 24 but also in a plurality of layers of the flexible substrate 24. For providing the reinforcing patterns 54 in a plurality of layers of the flexible substrate 24, it is preferable that the reinforcing pattern 54 in one layer and the reinforcing patterns 54 in another layer are formed at the same position and in the same pattern areas with each other so that it becomes possible to minimize a difference between expansion on the front surface side and expansion on the rear surface side of the flexible substrate 24 attributable to variations in temperature and humidity, to restrict warpage and breakage.

Figure 6:
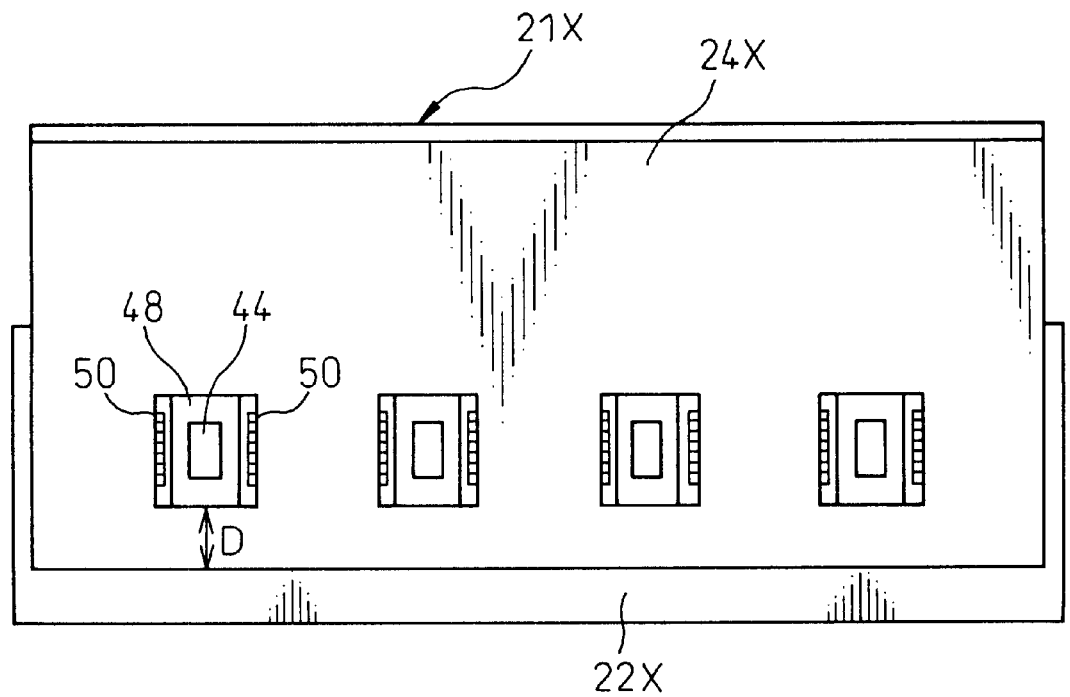
FIG. 6 is a plan view showing an example of a conventional electronic circuit module.

FIG. 6 is a plan view showing an example of a conventional electronic circuit module 21X. The electronic circuit module 21X comprises a rigid substrate 22X and a flexible substrate 24X. In the conventional electronic circuit module 21X having no reinforcing pattern 54, it is necessary to take a relatively large width D from an aperture 48 of the flexible substrate 24X to the outer edge thereof, in order to secure positional precision of a bonding pad 50 with respect to a terminal of a bare chip 44. When the width D is small, it is difficult to obtain a size precision necessary for wire bonding.

In the present invention, there is significance in the point that the reinforcing pattern 54 is provided in at least the first portion 24a of the flexible substrate 24 (a portion of the flexible substrate 24 that is adhered to the rigid substrate 22). When a flexible substrate is individually used, there is a case in which a reinforcing pattern may be provided in the peripheral region of the flexible substrate in order to obtain reinforcement. However, in the structure where the flexible substrate 24 is adhered to the rigid substrate 22, it is not necessary to provide a reinforcing pattern in the flexible substrate 24 only for the purpose of obtaining reinforcement, since the rigid substrate 22 has sufficient strength and rigidity. The reinforced pattern 54 of the present invention is provided for the purpose of reducing the size of the outer shape of the flexible substrate 24 and obtaining size precision necessary for wire bonding.

Figure 7:
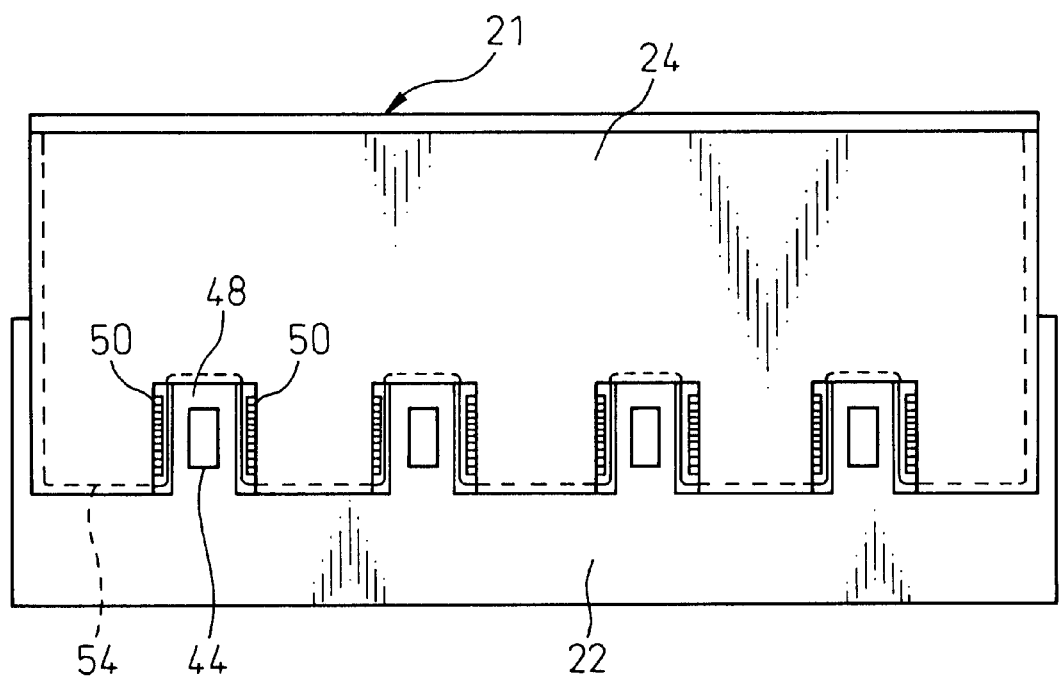
FIG. 7 is a plan view showing a modified example of the electronic circuit module shown in FIG. 4.

FIG. 7 is a plan view showing a modified example of the electronic circuit module 21 shown in FIG. 4. In this example, one side of the aperture 48 of the flexible substrate 24 is open to the outer edge, and the outer edge of the flexible substrate 24 is discontinuous at the aperture 48. A reinforcing pattern 54 is provided along the periphery of the flexible substrate 24 and the periphery of the aperture 48. With this arrangement, the reinforcing pattern 54 can make the flexible substrate 22 rigid without interfering with the wiring area of the signal lines. Therefore, it is possible to minimize a size variation based on the provision of the reinforcing pattern 54 near bonding pads 50 that particularly require size precision. As a result, it becomes possible to further decrease the size of the outer shape of the flexible substrate 24 and to obtain the size precision necessary for wire bonding. This leads to a reduction in cost.

Figure 8:
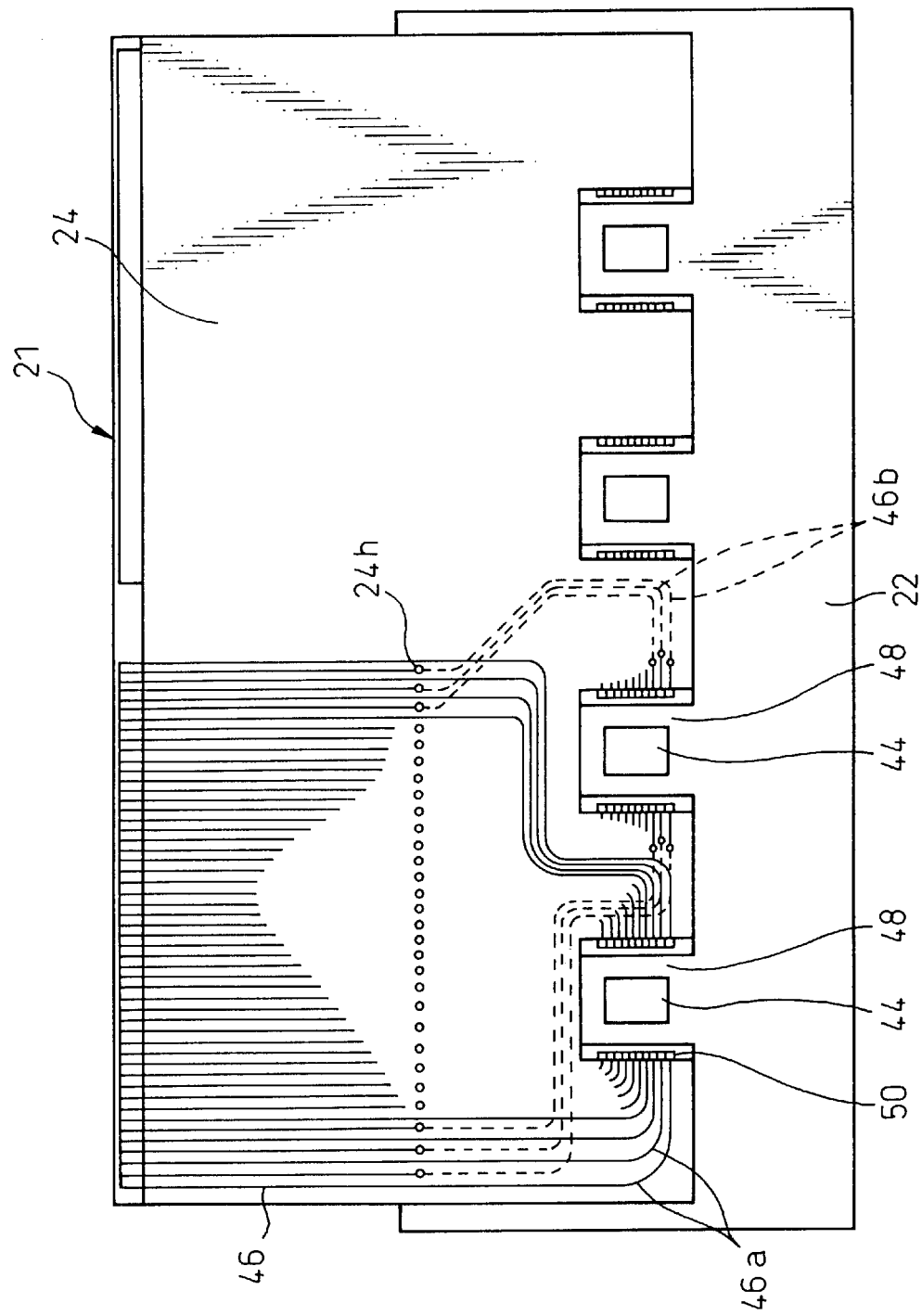
FIG. 8 is a view showing in detail conductor patterns of the flexible substrate of the electronic circuit module shown in FIG. 7.

FIG. 8 is a view showing, in detail, conductor patterns of the flexible substrate 24 of the electronic circuit module 21.

The basic structure of the electronic circuit module 21 shown in FIG. 8 is similar to that of the electronic circuit module 21 shown in FIG. 7. FIG. 8 shows a state that a resin layer on the upper side of the flexible substrate 24 is removed, and the conductor patterns 46 of the flexible substrate 24 are visible. The conductor patterns 46 include first and second conductor patterns 46a and 46b located on the upper and lower sides of the intermediate resin layer. The first conductor patterns 46a are connected to bonding pads 50 connected to the first bare chip 44 and extend along the upper surface of the intermediate resin layer. The second conductor patterns 46b are connected to the bonding pad 50 connected to the adjacent, second bare chip 44 and extend along the lower surface of the intermediate resin layer. The second conductor patterns 46b change their course onto the upper surface of the intermediate layer via through-holes 24h in the intermediate position of the flexible substrate 24, and extend along the upper surface of the intermediate resin layer. After the through-holes 24h, the first and second conductor patterns 46a and 46b are disposed alternately one by one on the upper surface of the intermediate resin layer. After the through-holes 24h, there are no conductor patterns on the lower surface of the intermediate resin layer.

In the conductor patterns 46, a dummy conductor pattern can be provided as a reinforcing pattern on the lower surface of the intermediate resin layer, since there are no conductor patterns on the lower surface of the intermediate resin layers after the through-holes 24h.

Figure 9:
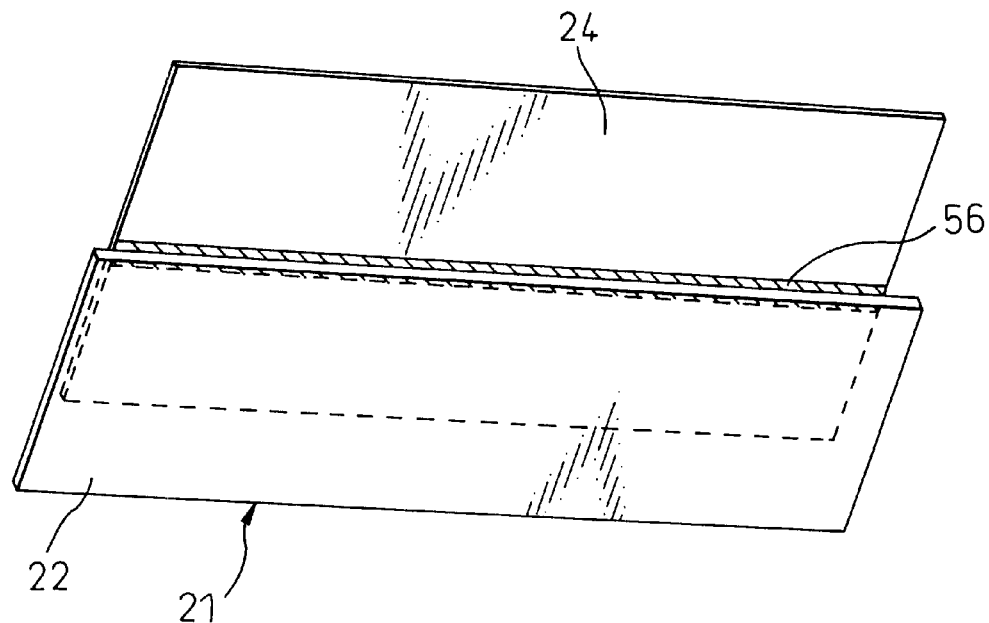
FIG. 9 is a perspective view showing another example of the electronic circuit module.

FIG. 9 is a perspective view showing another example of the electronic circuit module. In FIG. 9, the reinforcing pattern 56 is provided on the layer of the flexible substrate 24 which is different from the layer on which the conductor patterns 46 exist. The reinforcing pattern 56 is not connected electrically. In FIG. 9, the conductor patterns 46 are formed on the upper surface of the flexible substrate 24, and are not visible. The reinforcing pattern 56 is formed as a conductor film that extends long along the external edge of the rigid substrate 22 on the lower surface of the flexible substrate 24. As shown in FIG. 2, the flexible substrate 24 is bent to the greater extent near the outer edge of the rigid substrate 22, and is brought into contact with the outer edge of the rigid substrate 22. Therefore, this flexible substrate is a portion which might be easily damaged. The reinforcing pattern 56 reinforces the portion of the flexible substrate 24 that could be easily damaged.

Figure 10:
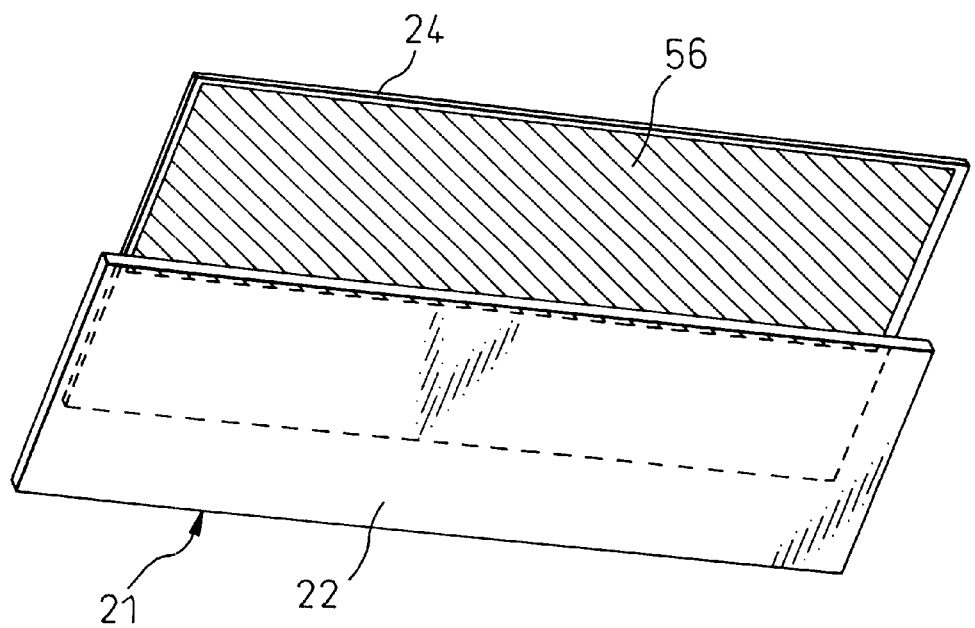
FIG. 10 is a perspective view showing still another example of the electronic circuit module.

FIG. 10 is a perspective view showing still another example of the electronic circuit module. In FIG. 10, the reinforcing pattern 56 is provided as an wholly covering film on the layer of the flexible substrate 24 separate from the layer on which the conductor patterns 46 exist. In FIG. 10, the conductor patterns 46 are formed on the upper surface of the flexible substrate 24, and are not visible. The reinforcing pattern 56 is formed as a conductor film adhered to a portion that is brought into contact with the outer edge of the rigid substrate 22 and a portion of the flexible substrate 24 positioned on the outside of the rigid substrate 22.

When the conductor patterns 46 are formed as shown in FIG. 8, the first and second conductor patterns 46a and 46b are disposed alternately one by one on the upper surface of the intermediate resin layer after the through-holes 24h. There are no conductor patterns on the lower surface of the intermediate resin layers after the through-holes 24h. Therefore, it is possible to provide with the reinforcing pattern 56 by adhesion to the whole lower surface of the intermediate resin layer that has no conductor patterns. The reinforcing pattern 56 reinforces the portion of the flexible substrate 24 that is easily damaged.

Figure 11:
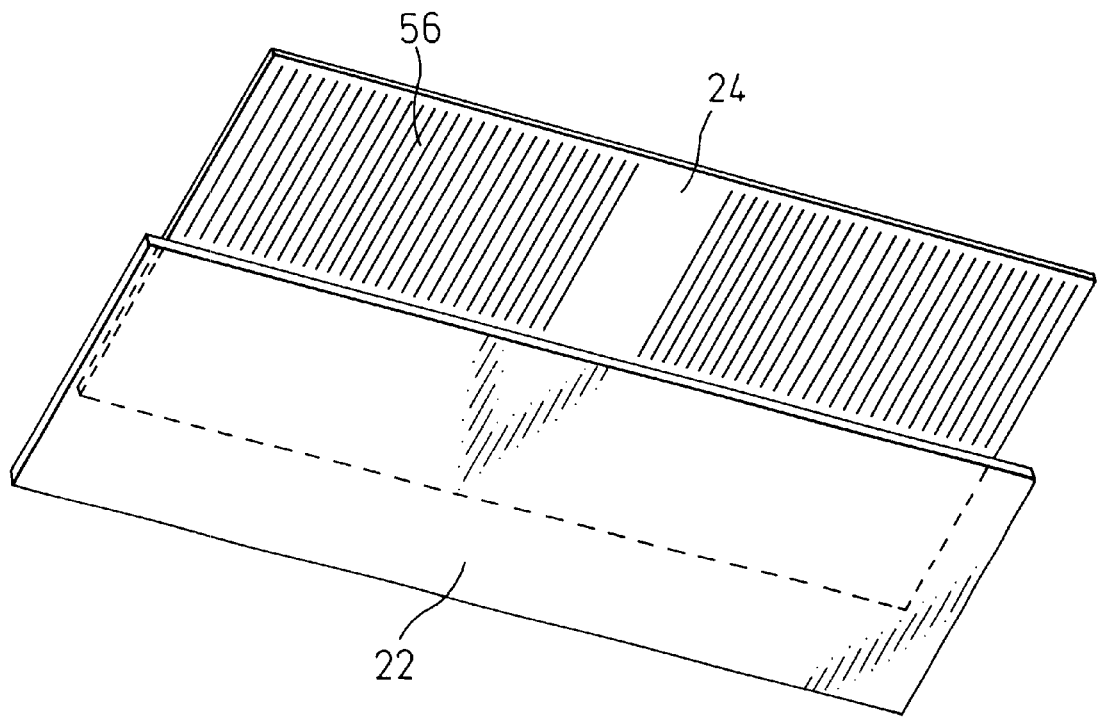
FIG. 11 is a perspective view showing still another example of the electronic circuit module.

FIG. 11 is a perspective view showing still another example of an electronic circuit module. In FIG. 11, the reinforcing pattern 56 is provided on the layer of the flexible substrate 24 separate from the layer on which the conductor patterns 46 exist. In FIG. 11, the conductor patterns 46 are not visible. The reinforcing pattern 56 is formed as a conductor film including conductor portions provided corresponding to individual conductor portions of the conductor patterns 46, at a portion that is brought into contact with the outer edge of the rigid substrate 22 and a portion of the flexible substrate 24 positioned on the outside of the rigid substrate 22. In this case as well, the first and second conductor patterns 46a and 46b are disposed alternately one by one on the upper surface of the intermediate resin layer after the through-holes 24h. There are no conductor patterns on the lower surface of the intermediate resin layers after the through-holes 24h. Therefore, it is possible to provide the reinforcing pattern 56 on the lower surface of the intermediate resin layer that has no conductor patterns. With this arrangement, the areas of the front and back patterns of the flexible substrate 24 become uniform, and it becomes possible to restrict warpage and breakage.

Figure 12:
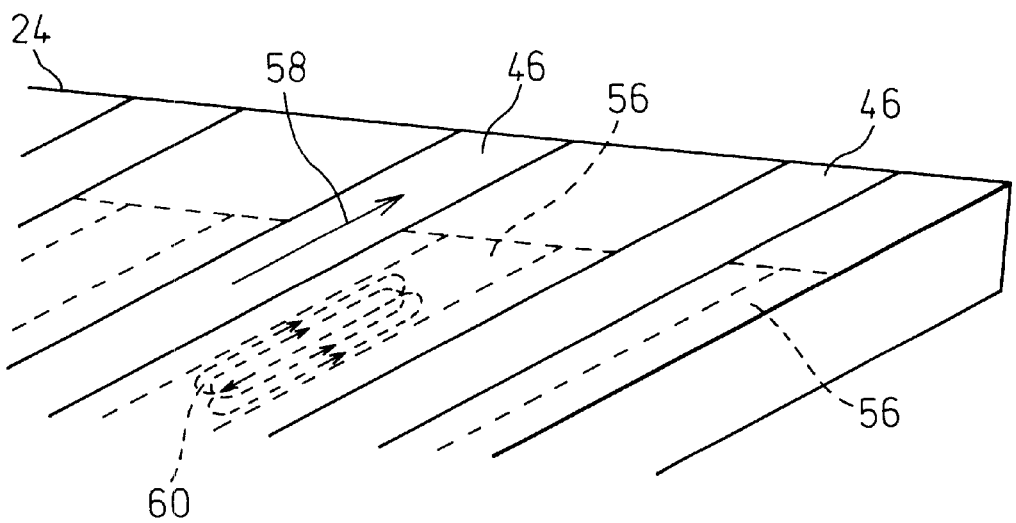
FIG. 12 is a perspective view showing a part of the flexible substrate shown in FIG. 11.

FIG. 12 is a perspective view showing a part of the flexible substrate 24 shown in FIG. 11. The conductor patterns 46 exist on the upper surface of the flexible substrate 24, and the reinforcing pattern 56 exists on the lower surface of the flexible substrate 24. It is preferable that the reinforcing pattern 56 is formed at the same position as the conductor patterns 46 and in the same pattern area as that of the conductor pattern 46. 58 denotes a current that flows through the conductor patterns 46. When the current 58 flows through the conductor patterns 46, an eddy current 60 is induced in the reinforcing pattern 56 due to electromagnetic inductance based on a high voltage applied to the conductor patterns 46. This eddy current 60 flows in a direction opposite to the direction of the current 58 that flows through the conductor patterns 46. As a result, it is possible to reduce the inductance of the conductor patterns 46, and to obtain satisfactory display characteristics of a glass panel (the display part). It is also possible to reduce the inductance based on the eddy current in the case of the pattern in the form of the wholly covering film, as shown in FIG. 10.

Figure 13:
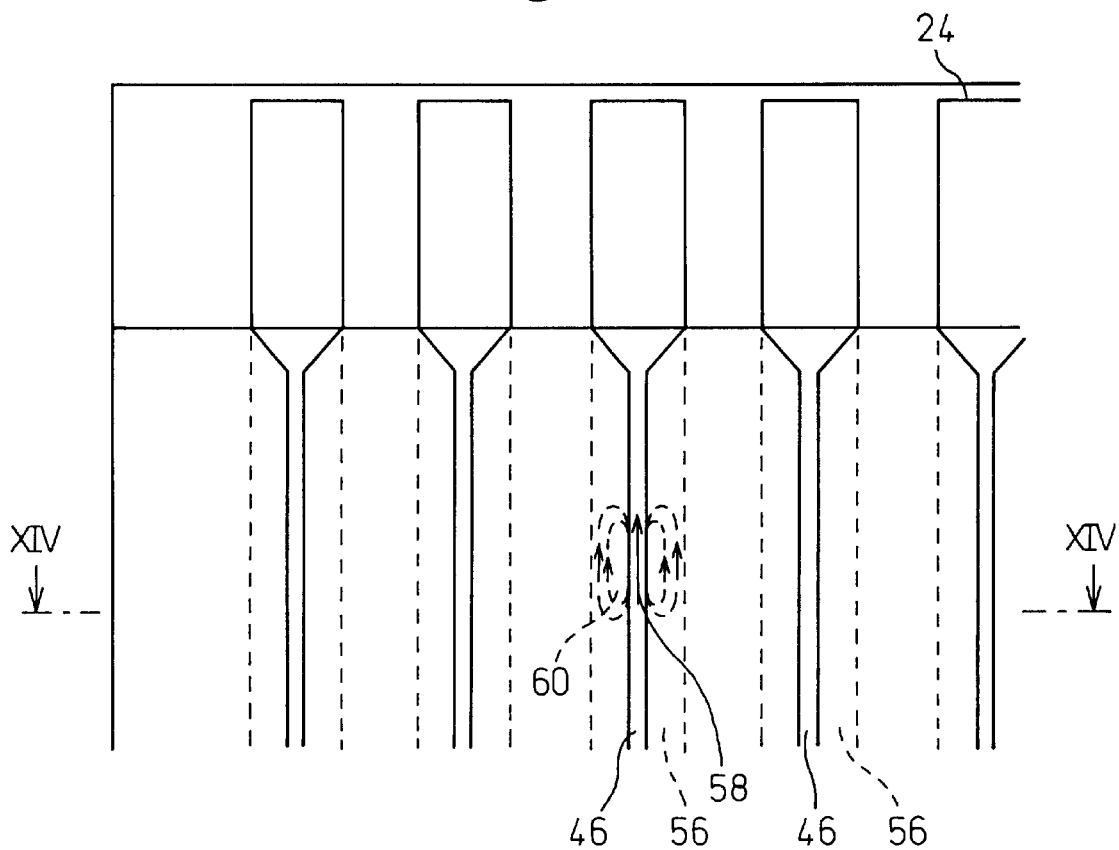
FIG. 13 is a view showing a modified example of the reinforcing patterns shown in FIG. 12.
Figure 14:
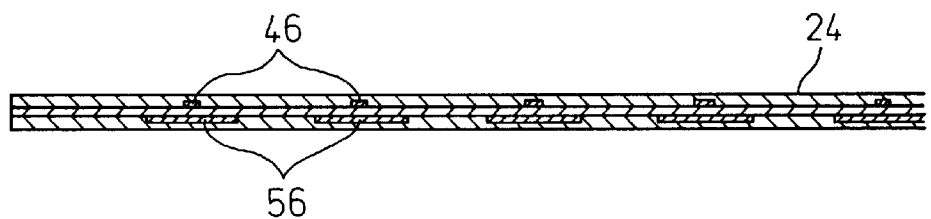
FIG. 14 is a cross-sectional view of the flexible substrate taken along the line XIV—XIV in FIG. 13.

FIG. 13 is a view showing a modified example of the reinforcing pattern shown in FIG. 12. FIG. 14 is a cross-sectional view of the flexible substrate 24 taken along the line XIV—XIV in FIG. 13. Conductor patterns 46 and the reinforcing pattern 56 are formed at the same positions, and the width of each conductor pattern 46 is smaller than the width of each reinforcing pattern 56. When the width of the reinforcing pattern 56 is made equal to or larger than the width of the conductor pattern 46 by cutting out a portion of the conductor pattern with a low current density, it is possible to expect the effect of low inductance.

Figure 15:
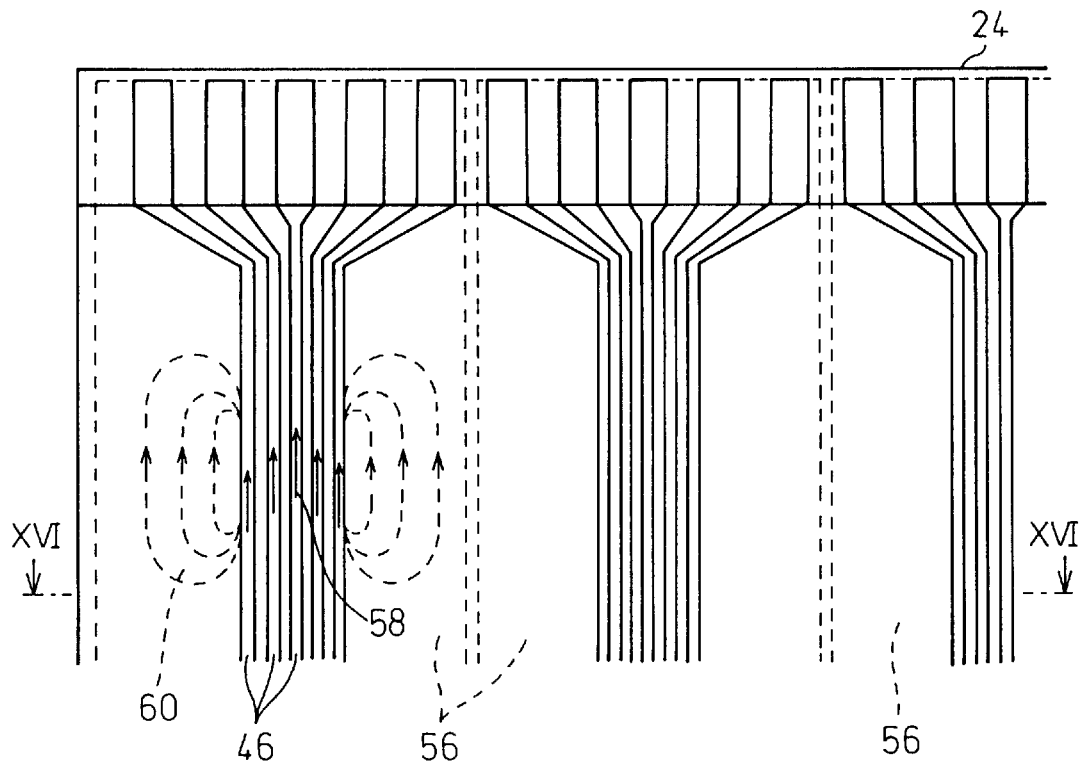
FIG. 15 is a view showing a modified example of the reinforcing patterns shown in FIG. 12.
Figure 16:
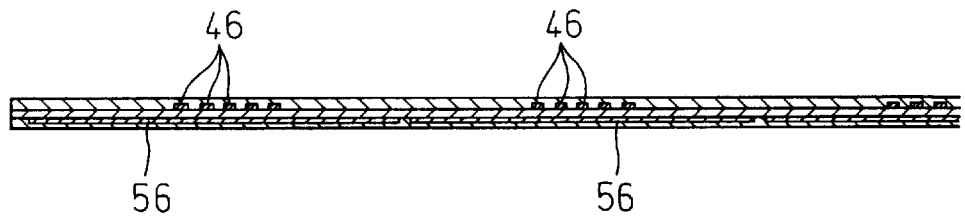
FIG. 16 is a cross-sectional view of the flexible substrate taken along the line XVI—XVI in FIG. 15.

FIG. 15 is a view showing a modified example of the reinforcing pattern shown in FIG. 12. FIG. 16 is a cross-sectional view of the flexible substrate 24 taken along the line XVI—XVI in FIG. 15. A plurality of conductor patterns 46 are disposed as one set. Each one set of the conductor patterns 46 is formed to have a small width, and the conductor patterns 46 are disposed close to each other. Reinforcing pattern 56 is provided for each one set of the conductor patterns 46. With this arrangement, it is possible to expect the effect of low inductance.

Figure 17:
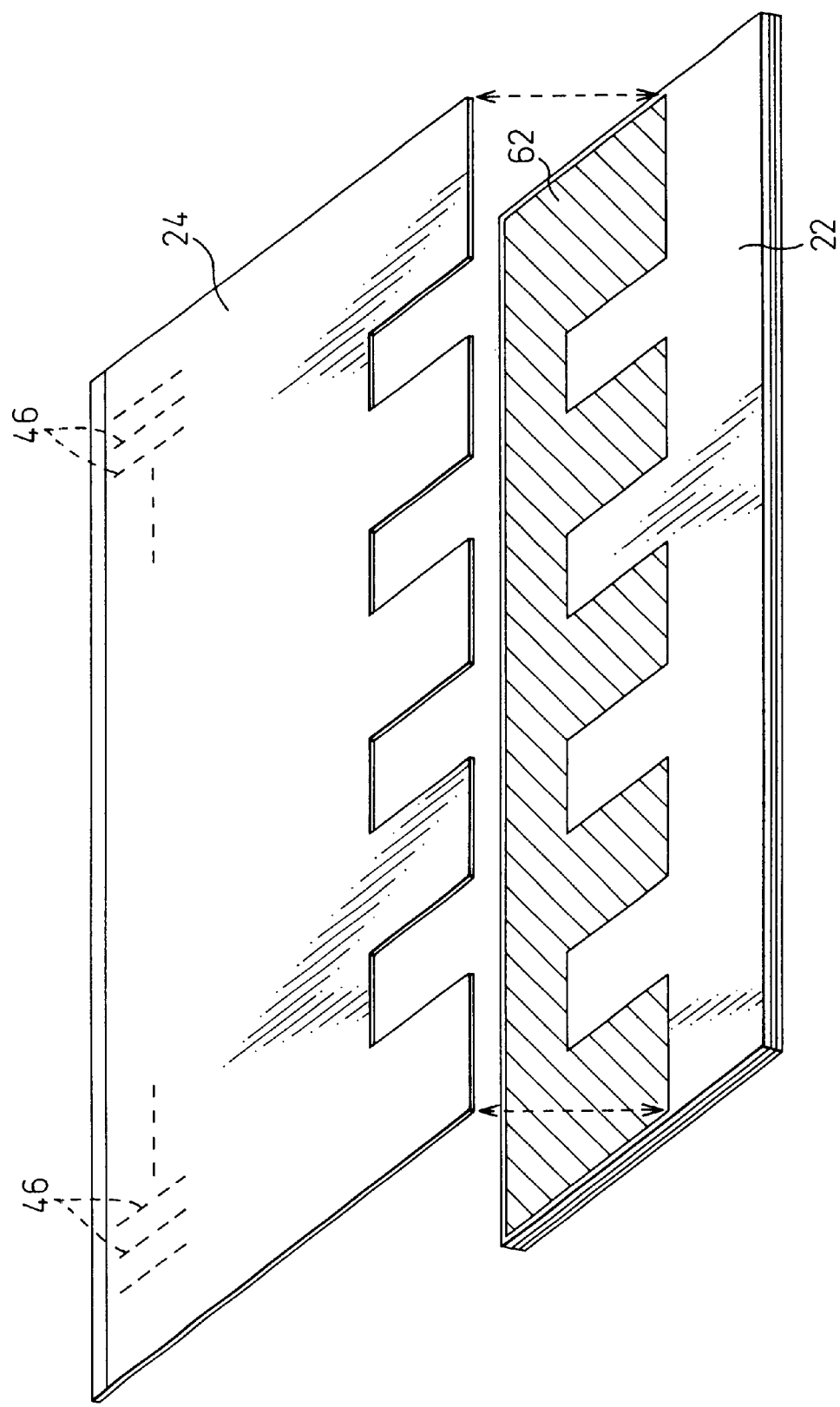
FIG. 17 is a view showing an example in which a dummy pattern is provided in the rigid substrate.

FIG. 17 is a view showing an example where a dummy pattern is provided on the rigid substrate. The flexible substrate 24 has conductor patterns 46 and the abovedescribed reinforcing pattern 56 (not shown). The rigid substrate 22 has a dummy pattern 62. It is preferable that the dummy pattern 62 is formed in the form of the covering film having a large area. In this structure, the patterns are formed based on a method of achieving a reduction in inductance on the flexible substrate 24, and the dummy pattern 62 is provided by adhesion to the rigid substrate 22 on a wide area. This makes it possible to reduce inductance by utilizing more effectively the eddy current 60.

FIG. 18 is a view showing an example where electric parts are provided straddling both on the flexible substrate 24 and the rigid substrate 22. The first foot pattern 64 is provided on the flexible substrate 24, and the second foot pattern 66 is provided on the rigid substrate 22. A first portion of each electric part (electronic part) 68 is fixed to each first foot pattern 64, and a second portion of each electric part (electronic part) 68 is fixed to each second foot pattern 66. In the case of carrying out soldering by reflow, it is possible to avoid failure in applying a soldering paste due to a difference in the heights of the two substrates, by adjusting a paste volume to be coated onto the two substrates. The electric parts (electronic parts) 68 are disposed to extend over the rigid substrate 22 and the flexible substrate 24, thereby to electrically connect between the rigid substrate 22 and the flexible substrate 24. As a result, it is possible to decrease the number of wires to be applied between the rigid substrate 22 and the flexible substrate 24. Based on this mounting method, it becomes possible to electrically connect between various kinds of substrates through parts. It is also possible to improve the wiring efficiency on mutual substrates, and to decrease the area of the substrates.

As explained above, according to the present invention, it is possible to restrict occurrence of warpage, breakage and tearing, and to decrease the cost of substrates while decreasing the areas of the substrates. Further, it is possible to obtain a plasma display apparatus with satisfactory electrical characteristics.

What is claimed is:

1. A plasma display apparatus comprising:
    a plasma display panel having a plurality of electrodes for emission of light;
    an electronic circuit module including a rigid substrate having at least one chip, and a flexible substrate coupled to the rigid substrate and having a first portion with an aperture for exposing the chip and bonding pads and a second portion positioned on the outside of the rigid substrate;
    bonding wires for connecting terminals of the chip with the bonding pads of the flexible substrate; and
    a reinforcing pattern provided in at least the first portion of the flexible substrate.

2. A plasma display apparatus comprising;
    a plasma display panel having a plurality of electrodes for emission of light;
    an electronic circuit module including a rigid substrate, and a flexible substrate coupled to the rigid substrate and having conductor patterns electrically connected to the electrodes of the plasma display panel; and
    a reinforcing pattern provided in a layer of the flexible substrate separate from a layer in which the conductor patterns exist.

3. A plasma display apparatus according to claim 2, wherein the reinforcing pattern is provided at a position overlapping with the conductor patterns.

4. A plasma display apparatus comprising:
    a plasma display panel having a plurality of electrodes for emission of light;
    an electronic circuit module including a rigid substrate, and a flexible substrate coupled to the rigid substrate and having conductor patterns electrically connected to the electrodes of the plasma display panel; and
    a dummy pattern provided on the rigid substrate.

5. A plasma display apparatus comprising:
    a plasma display panel having a plurality of electrodes for emission of light;
    an electronic circuit module including a rigid substrate, and a flexible substrate coupled to the rigid substrate and having conductor patterns electrically connected to the electrodes of the plasma display panel; and
    an electric part having a first portion fixed to the flexible substrate and a second portion fixed to the rigid substrate.

\* \* \* \* \*

UNITED STATES PATENT AND TRADEMARK OFFICE
CERTIFICATE OF CORRECTION

PATENT NO.   : 6,538,382 B2
DATED        : March 25, 2003
INVENTOR(S)  : Kenji Kimura et al.

It is certified that error appears in the above-identified patent and that said Letters Patent is hereby corrected as shown below:

<u>Title page,</u>
Item [75], Inventors, please correct the spelling of the last name of the second inventor as follows, change "Kawahara" to -- Kuwahara --.

Signed and Sealed this

Eighth Day of July, 2003

JAMES E. ROGAN
*Director of the United States Patent and Trademark Office*